United States Patent
Bi et al.

(10) Patent No.: US 12,225,753 B2
(45) Date of Patent: Feb. 11, 2025

(54) DISPLAY MODULE AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xin Bi, Beijing (CN); Wei Gong, Beijing (CN); Yanli Wang, Beijing (CN); Jiaxiang Wang, Beijing (CN); Yangyang Cai, Beijing (CN); Xinqi Lin, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 305 days.

(21) Appl. No.: 17/915,529

(22) PCT Filed: Oct. 21, 2021

(86) PCT No.: PCT/CN2021/125421
§ 371 (c)(1),
(2) Date: Sep. 29, 2022

(87) PCT Pub. No.: WO2022/095716
PCT Pub. Date: May 12, 2022

(65) Prior Publication Data
US 2023/0123422 A1    Apr. 20, 2023

(30) Foreign Application Priority Data

Nov. 6, 2020 (CN) .......................... 202022551399.6

(51) Int. Cl.
*G06F 1/00* (2006.01)
*G06F 1/16* (2006.01)
(Continued)

(52) U.S. Cl.
CPC ........... *H10K 50/84* (2023.02); *G06F 1/1652* (2013.01); *H05K 5/02* (2013.01); *H10K 2102/311* (2023.02)

(58) Field of Classification Search
CPC ................................ G06F 1/1652; H05K 5/02
(Continued)

(56) References Cited

U.S. PATENT DOCUMENTS 9,379,355 B1    6/2016  Lee
9,847,506 B2    12/2017 Lee
(Continued)

FOREIGN PATENT DOCUMENTS

CN    106710450 A    5/2017
CN    106710452 A    5/2017
(Continued)

OTHER PUBLICATIONS

Written Opinion from PCT/CN2021/125421 dated Jan. 19, 2022.

*Primary Examiner* — Zhengfu J Feng
(74) *Attorney, Agent, or Firm* — Calfee, Halter & Griswold LLP

(57) ABSTRACT

A display module includes a flexible display panel including a display portion, a binding portion, and a bending portion; a first back film, a second back film fitted to the display portion and the binding portion, respectively, an auxiliary support layer located between the first and second back films, bonded with the back films through first and second adhesive layers, respectively, and provided with an elastic modulus greater than the first and second back films; orthographic projections of the back films are located in or (Continued)

overlaps with those of the display portion and the bind portion, respectively. Side edges of the first and second back films and the auxiliary support layer close to the bending portion are first, second and third side edges, respectively; a spacing between the third and first side edges and a spacing between the third and second side edges are 0-0.35 mm.

20 Claims, 2 Drawing Sheets

(51) Int. Cl.
  *H05K 5/02* (2006.01)
  *H10K 50/84* (2023.01)
  *H10K 102/00* (2023.01)

(58) Field of Classification Search
  USPC .......................................................... 361/807
  See application file for complete search history.

(56) References Cited

U.S. PATENT DOCUMENTS

| | | | |
|---|---|---|---|
| 10,212,811 | B1 | 2/2019 | Zhang et al. |
| 10,505,147 | B2 | 12/2019 | Lee |
| 10,645,205 | B2 | 5/2020 | Lee |
| 10,693,089 | B2 | 6/2020 | He et al. |
| 11,050,030 | B2 | 6/2021 | Zhu |
| 2016/0172623 | A1* | 6/2016 | Lee ...................... H10K 59/131 257/40 |
| 2016/0268546 | A1 | 9/2016 | Lee |
| 2017/0162821 | A1* | 6/2017 | Oh ...................... H10K 50/8445 |
| 2018/0040838 | A1* | 2/2018 | Zhai ...................... H10K 59/124 |
| 2018/0090713 | A1 | 3/2018 | Lee |
| 2019/0082528 | A1* | 3/2019 | Zhang ...................... H10K 59/12 |
| 2019/0207130 | A1* | 7/2019 | He ...................... H10K 71/80 |
| 2019/0245955 | A1 | 8/2019 | Lee |
| 2021/0091318 | A1* | 3/2021 | Zhu .......................... B32B 3/04 |

FOREIGN PATENT DOCUMENTS

| | | |
|---|---|---|
| CN | 107004698 A | 8/2017 |
| CN | 107611161 A | 1/2018 |
| CN | 108198842 A | 6/2018 |
| CN | 109559646 A | 4/2019 |
| CN | 209297266 U | 8/2019 |
| CN | 110277435 A | 9/2019 |
| CN | 110718152 A | 1/2020 |
| CN | 110718156 A | 1/2020 |
| CN | 110718159 A | 1/2020 |
| CN | 110853510 A | 2/2020 |
| CN | 110890480 A | 3/2020 |
| CN | 213183388 U | 5/2021 |
| EP | 3235001 A1 | 10/2017 |
| WO | 2016099025 A1 | 6/2016 |
| WO | 2018196295 A1 | 11/2018 |

* cited by examiner

DISPLAY MODULE AND DISPLAY APPARATUS

CROSS-REFERENCE

The present disclosure is a U.S. National Stage of International Application No. PCT/CN2021/125421, filed on Oct. 21, 2021, which claims priority to Chinese patent application No. 202022551399.6, entitled "DISPLAY MODULE AND DISPLAY APPARATUS", filed on Nov. 6, 2020, the entire content of which is incorporated herein by reference.

TECHNICAL FIELD

The present disclosure relates to a technical field of display, and more particularly to a display module and a display apparatus.

BACKGROUND

Nowadays, in order to realize a full-screen design, a flexible display panel is usually bound with structure, such as a flexible circuit board and the like, on a back side of the flexible display panel. That is, a binding portion of the flexible display panel is bent to the back side of a display portion of the flexible display paned and bound with the structure, such as the flexible circuit board and the like. However, due to a relatively small elastic modulus of the flexible display panel, it is difficult to for the flexible display panel to start bending at a predetermined position without a certain support, which easily causes poor bending, thus further leads to loss of process yield and even affects the assembly of a whole machine.

It should be noted that the information disclosed in the above BACKGROUND section is only for enhancing the understanding of the background of the present disclosure, and thus may include information that does not constitute the prior art known to those of ordinary skill in the art.

SUMMARY

The present disclosure aims to provide a display module and a display apparatus, so as to ensure that a flexible display panel starts bending at a predetermined position, thereby improving the process yield.

A first aspect of the present disclosure provides a display module, and the display module includes:
 a flexible display panel including a display portion, a binding portion at a back side of the display portion, and a bending portion connecting the display portion and the binding portion;
 a first back film located between the display portion and the binding portion and fitted to the back side of the display portion, wherein an orthographic projection of the first back film on a reference plane is located in or overlaps with an orthographic projection of the display portion on the reference plane; a side edge of the first back film close to the bending portion is a first side edge;
 a second back film fitted to a side of the binding portion facing the display portion, wherein an orthographic projection of the second back film on the reference plane is located in or overlaps with an orthographic projection of the binding portion on the reference plane; a side edge of the second back film close to the bending portion is a second side edge;
 an auxiliary support layer located between the first back film and the second back film, wherein the auxiliary support layer is bonded with the first back film through a first adhesive layer, and is bonded with the second back film through a second adhesive layer; a side edge of the auxiliary support layer close to the bending portion is a third side edge;
 wherein a spacing between the third side edge and the first side edge ranges from 0 to 0.35 mm, a spacing between the third side edge and the second side edge ranges from 0 to 0.35 mm; and
 an elastic modulus of the auxiliary support layer is greater than an elastic modulus of the first back film and greater than an elastic modulus of the second back film, and the reference plane is a plane perpendicular to a thickness direction of the display module.

In an embodiment of the present disclosure, a boundary line between the bending portion and the display portion is a first boundary line, and a boundary line between the bending portion and the binding portion is a second boundary line; wherein:
 the first side edge is located on a side of the first boundary line away from the bending portion and a spacing between the first side edge and the first boundary line is less than or equal to 0.1 mm; and
 the second side edge is located on a side of the second boundary line away from the bending portion and a spacing between the second side edge and the second boundary line is less than or equal to 0.1 mm.

In an embodiment of the present disclosure, the third side edge is flush with at least one of the first side edge and the second side edge.

In an embodiment of the present disclosure, the first side edge, the second side edge and the third side edge are flush with each other.

In an embodiment of the present disclosure, the third side edge is located on sides of the first side edge and the second side edge away from the bending portion.

In an embodiment of the present disclosure, the elastic modulus of the auxiliary support layer ranges from 150 GPa to 200 GPa, and the elastic modulus of the first back film and the elastic modulus of the second back film range from 3 GPa to 9 GPa.

In an embodiment of the present disclosure, a material of the auxiliary support layer is stainless steel, and a material of the first back film and a material of the second back film are polyethylene terephthalate or polyimide.

In an embodiment of the present disclosure, a thickness of the auxiliary support layer ranges from 30 μm to 150 μm.

In an embodiment of the present disclosure, the orthographic projection of the binding portion on the reference plane overlaps with a partial region of the orthographic projection of the display portion on the reference plane.

In an embodiment of the present disclosure, an orthographic projection of the first adhesive layer on the reference plane overlaps with the orthographic projection of the first back film on the reference plane; or
 an outer contour of an orthographic projection of the first adhesive layer on the reference plane is located on an inner side of an outer contour of the orthographic projection of the first back film on the reference plane, and a spacing between the outer contour of the orthographic projection of the first adhesive layer on the reference plane and the outer contour of the orthographic projection of the first back film on the reference plane is less than or equal to 0.2 mm.

In an embodiment of the present disclosure, an orthographic projection of the second adhesive layer on the reference plane overlaps with the orthographic projection of the second back film on the reference plane; or an outer contour of an orthographic projection of the second adhesive layer on the reference plane is located on an inner side of an outer contour of the orthographic projection of the second back film on the reference plane, and a spacing between the outer contour of the orthographic projection of the second adhesive layer on the reference plane and the outer contour of the orthographic projection of the second back film on the reference plane is less than or equal to 0.2 mm.

In an embodiment of the present disclosure, an elastic modulus of the first adhesive layer is less than an elastic modulus of the second adhesive layer.

In an embodiment of the present disclosure, the first adhesive layer is an optical adhesive layer or a foam adhesive, and the second adhesive layer is a pressure sensitive adhesive.

In an embodiment of the present disclosure, the first adhesive layer is the optical adhesive layer, and a thickness of the optical adhesive layer ranges from 20 μm to 50 μm; or the first adhesive layer is the foam adhesive, and a thickness of the foam adhesive is greater than or equal to 130 μm.

In an embodiment of the present disclosure, the display module further includes: a strain neutral adhesive layer, wherein the strain neutral adhesive layer covers an outer side of the bending portion as well as edge parts of the display portion and the binding portion.

A second aspect of the present disclosure provides a display apparatus, and the display apparatus includes a flexible circuit board and any one of the above-mentioned display modules, and the binding portion of the flexible display panel is bound to the flexible circuit board.

It should be understood that the preceding general description and the following detailed description are exemplary and explanatory only and are not restrictive of the present disclosure.

BRIEF DESCRIPTION OF THE DRAWINGS

The accompanying drawings here are incorporated in the specification and constitute a part of this specification, show embodiments in accordance with the present disclosure and serve to explain the principles of the present disclosure together with the specification. Obviously, the drawings in the following description are only some embodiments of the present disclosure, and for those ordinary skills in the art, other drawings can also be obtained from these drawings without creative efforts.

DETAILED DESCRIPTION

Figure 1:
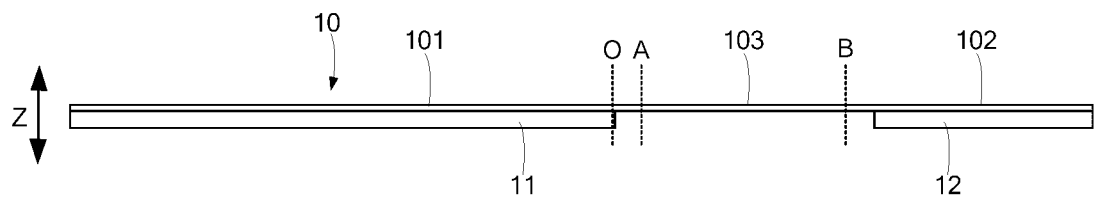
FIG. 1 shows a structural diagram of a display module in an expanded state according to an embodiment of the present disclosure.

In order to make the objectives, technical solutions, and advantages of the present disclosure clear, the embodiments of the present disclosure will be described in detail below with reference to the accompanying drawings. It should be noted that the embodiments can be implemented in a number of different forms. Those of ordinary skill in the technical field can easily understand the fact that the method and content can be transformed into various forms without departing from the purpose and scope of the present disclosure. Therefore, the present disclosure should not be interpreted as being limited to the content described in the following embodiments. In the case of no conflict, the embodiments in the present disclosure and the features in the embodiments may be combined with each other arbitrarily.

In the drawings, for the sake of clarity, the size, the thickness, or the area of each constituent element may be exaggerated. Therefore, an embodiment of the present disclosure is not necessarily limited to this size, and the shape and size of each component in the drawings do not reflect the true ratio. In addition, the drawings schematically show ideal examples, and an embodiment of the present disclosure is not limited to the shapes, numerical values, or the like shown in the drawings.

It should be noted that terms "on", described herein may mean that one layer is directly formed or placed on another layer, or one layer is indirectly formed or arranged on another layer, that is, there are other layers between the two layers.

Terms "one", "a", and "the" are used to indicate the presence of one or more elements/components, etc.; term "include" is used to indicate an open type meaning of including and means that there may be additional elements/components/etc. in addition to the listed elements/components/etc.

The ordinal numbers "first", "second", and the like in this specification are used to avoid confusion between constituent elements, but not to constitute limitations on quantities.

In this specification, term "connection" shall be understood in a broad sense unless otherwise explicitly specified and defined. For example, a connection may be a fixed connection, or may be a detachable connection, or an integrated connection; it may be a mechanical connection, or may be an electrical connection; it may be a direct connection, or may be an indirect connection through middleware, or may be an internal communication between two elements. Those of ordinary skills in the art can understand the specific meanings of the above mentioned terms in the present disclosure according to specific situations.

Figure 2:
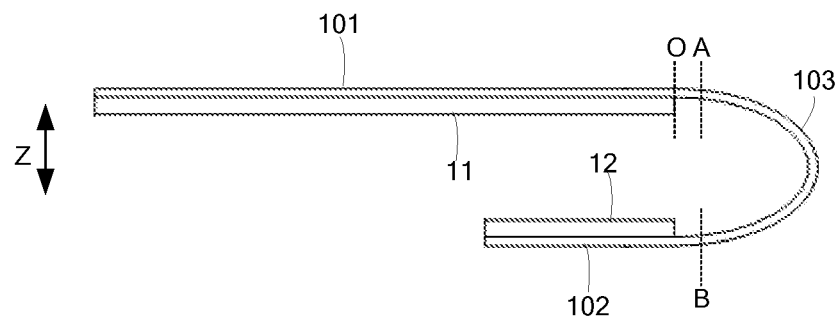
FIG. 2 shows a structure diagram of the display module shown in FIG. 1 after being bent.

Embodiments of the present disclosure provide a display module, as shown in FIGS. 1 and 2. The display module may include a flexible display panel 10, a first back film 11 and a second back film 12. Specifically:

the flexible display panel 10 may include a display portion 101 (a part on a left side of a dotted line A in FIG. 1), a binding portion 102 (a part on a right side of a dotted line B in FIG. 1), and a bending portion 103 (a part between the dotted line A and the dotted line B in FIG. 1) connecting the display portion 101 and the binding portion 102. The display portion 101 is provided with a display side and a back side opposite to each other in a thickness direction Z of the display module. For example, the display portion 101 in the embodiment of the present disclosure may display OLED (Organic Light-Emitting Diode). The binding portion 102 is provided with a binding side and a back side that are opposite in a thickness direction Z. In the embodiment of the present disclosure, the binding portion 102 is bent to the back side of the display portion 101, and the back side of the binding portion 102 is closer to the display portion 101 than the binding side of the binding portion 102. That is, the back side of the binding portion 102 faces the back side of the display portion 101. The dotted lines A and B represent a starting position and an ending position of the flexible display panel 10, respectively.

The first back film 11 may be located between the display portion 101 and the binding portion 102 and fitted to the back side of the display portion 101. An orthographic projection of the first back film 11 on a reference plane is located in or overlaps with an orthographic projection of the display portion 101 on the reference plane. The second back film 12 may be fitted to a side of the binding portion 102 facing the display portion 101 (i.e., the back side of the binding portion 102). An orthographic projection of the second back film 12 on the reference plane is located in or overlaps with an orthographic projection of the binding portion 102 on the reference plane.

In the embodiment of the present disclosure, by the arrangement that the first back film 11 and the second back film 12 is arranged on the back side of the display portion 101 and the back side of the binding portion 102 in the flexible display panel 10, respectively, the display portion 101 and the binding portion 102 may be protected or buffered. It should be noted that the bending portion 103 of the flexible display panel 10 is not provided with a back film, and such design may ensure bending performance of the bending portion 103.

For example, materials of the first back film 11 and the second back film 12 may be polyethylene terephthalate (PET) or polyimide (PI), but are not limited thereto. The materials of the first back film 11 and the second back film 12 may be the same.

It should be noted that since the materials of the first back film 11 and the second back film 12 in the embodiments of the present disclosure are PET or PI, an elastic modulus of the first back film 11 and an elastic modulus of the second back film are relatively small. Specifically, the elastic modulus of the first back film 11 and the elastic modulus of the second back film 12 may range from 3 GPa to 9 GPa, such as 3 GPa, 5 GPa, 7 GPa, 9 GPa, and the like. The flexible display panel 10 cannot be strongly supported at positions close to a bending part of the flexible display panel 10, and that is, the display portion 101 and the binding portion 102 of the flexible display panel 10 are not provided with sufficient support. In this way, during the binding portion 102 is bent to the back side of the display portion 101, it is hard for the flexible display panel 10 to start bending at a predetermined position (i.e., a position of the dotted line A in FIG. 1), which causes that the flexible display panel 10 starts bending in advance (i.e., the flexible display panel 10 starts to bend at a position of a dotted line O shown in FIG. 1). That is, the bending starts at a part of the display portion 101 close to the bending portion 103. A shape of the flexible display panel 10 after being bent is shown in FIG. 2, which illustrates a situation of poor bending.

Figure 3:
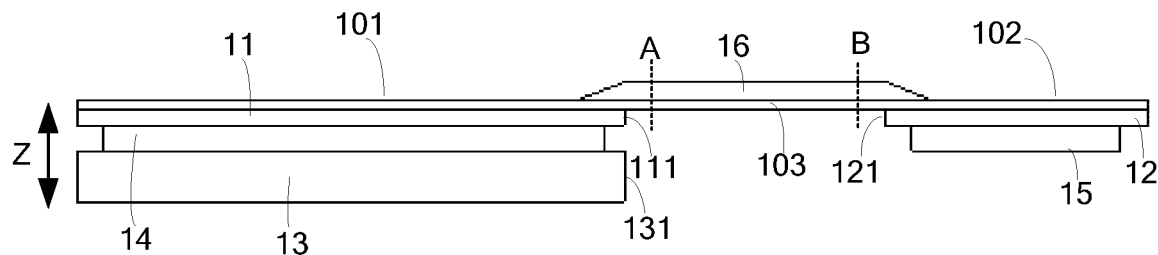
FIG. 3 shows a structural diagram of a display module in an expanded state according to another embodiment of the present disclosure.
Figure 4:
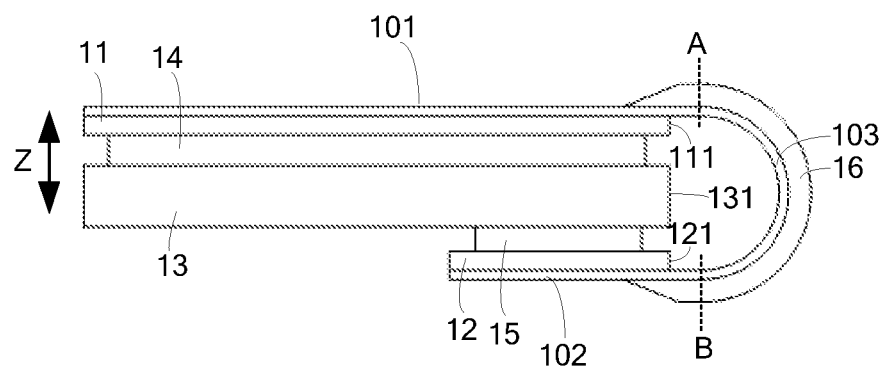
FIG. 4 shows a structure diagram of the display module shown in FIG. 3 after being bent.

In order to improve the above situation, as shown in FIGS. 3 to 6, the display module according to the embodiment of the present disclosure may also include an auxiliary support layer 13, which may be located between the first back film 11 and the second back film 12, and the auxiliary support layer 13 may be bonded with the first back film 11 through a first adhesive layer 14, and be bonded with the second back film 12 through a second adhesive layer 15. An elastic modulus of the auxiliary support layer 13 may be greater than the elastic modulus of the first back film 11 and the elastic modulus of the second back film 12. Thus, the design may assist the first back film 11 and the second back film 12 to support the display portion 101 and the binding portion 102, so as to prevent the flexible display panel 10 from bending in advance, that is, to ensure that the flexible display panel may be bent at a predetermined position (the dotted line A shown in FIG. 3), and to keep an overall bending shape of the flexible display panel 10, as shown in FIG. 4, thereby preventing the poor bending of the flexible display panel 10, and thus improving the process yield.

For example, a material of the auxiliary support layer 13 may be stainless steel (SUS) to ensure that the auxiliary support layer 13 has good support performance, or may also be other material, as long as the auxiliary support layer 13 has the good support performance, which is not limited herein. The elastic modulus of the auxiliary support layer 13 may range from 150 GPa to 200 GPa, such as 150 GPa, 175 GPa, 200 GPa, etc.

Optionally, a thickness of the auxiliary support layer 13 may range from 30 μm to 150 μm, such as 30 μm, 50 μm, 100 μm, 150 μm and the like, so as to ensure the support strength of the auxiliary support layer 13.

It should be noted that the above-mentioned reference plane in the embodiments of the present disclosure may be a plane perpendicular to the thickness direction Z of the display module.

Structure of the display module according to the embodiments of the present disclosure is described in detail below with reference to the drawings.

A boundary line between the bending portion 103 and the display portion 101 in the flexible display panel 10 is a first boundary line (the first boundary line is the dotted line A shown in FIGS. 1 to 6), and a boundary line between the bending portion 103 and the binding portion 102 is a second boundary line (the second boundary line is the dotted line B shown in FIGS. 1 to 6). A side edge of the first back film 11 close to the bending portion 103 is a first side edge 111, a side edge of the second back film 12 close to the bending portion 103 is a second side edge 121, and a side edge of the auxiliary support layer 13 close to the bending portion 103 is a third side edge 131, as shown in FIGS. 3 to 6.

As shown in FIGS. 3 to 6, the first side edge 111 of the first back film 11 may be located on a side of the first boundary line A away from the bending portion 103, and a spacing between the first side edge 111 of the first back film 11 and the first boundary line A may be less than or equal to 0.1 mm. The second side edge 121 of the second back film 12 is located on a side of the second boundary line away from the bending portion 103, and a spacing between the second side edge 121 of the second back film 12 and the second boundary line may be less than or equal to 0.1 mm. Such design may improve the protection and buffering effect of the first back film 11 and the second back film 12 on the display portion 101 and the binding portion 102 of the flexible display panel 10 while meeting the bending accuracy.

It should be noted that the above-mentioned spacing of the present disclosure refers to a minimum spacing between two objects.

In an embodiment of the present disclosure, as shown in FIGS. 3 and 4, the third side edge 131 of the auxiliary support layer 13 may be flush with at least one of the first side edge 111 of the first back film 11 and the second side edge 121 of the second back film 12. Such design may improve the supporting effect of the auxiliary support layer 13 on the first back film 11 and the second back film 12, ensure that regions of both sides of the bending portion 103 (i.e., the regions where the display portion 101 and the binding portion 102 are located) have high strength, and prevent the flexible display panel 10 from bending in advance during the bending.

For example, when the first side edge 111 of the first back film 11 is further away from the bending portion 103 than the second side edge 121 of the second back film 12, the third side edge 131 of the auxiliary support layer 13 may be flush with the first side edge 111 of the first back film 11. When the first side edge 111 of the first back film 11 is closer to the bending portion 103 than the second side edge 121 of the second back film 12, the third side edge 131 of the auxiliary support layer 13 may be flush with the second side edge 121 of the second back film 12. When the first side edge 111 of the first back film 11 is flush with the second side edge 121 of the second back film 12, the first side edge 111, the second side edge 121 and the third side edge 131 are flush with each other, referring to FIGS. 3 and 4.

In the present embodiment, through the arrangement that the third side edge 131 of the auxiliary support layer 13 is flush with at least one of the first side edge 111 of the first back film 11 and the second side edge 121 of the second back film 12, the regions of both sides of the bending portion 103 (i.e., the regions where the display portion 101 and the binding portion 102 are located) have high strength, which also prevents the auxiliary support layer 13 from damaging the bending portion 103.

Figure 5:
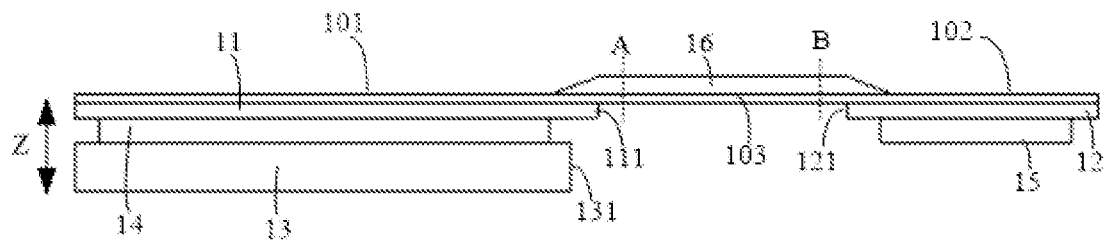
FIG. 5 shows a structural diagram of a display module in an expanded state according to yet another embodiment of the present disclosure.
Figure 6:
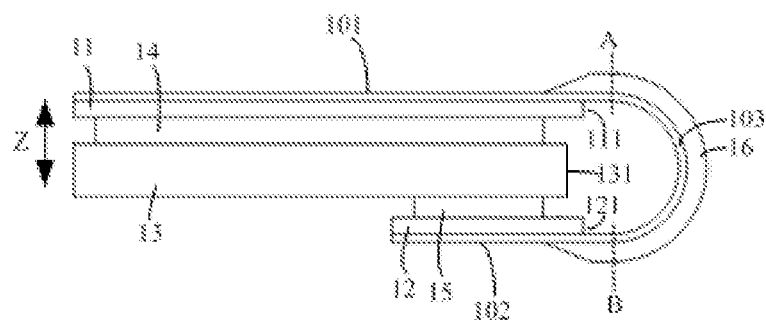
FIG. 6 shows a structure diagram of the display module shown in FIG. 5 after being bent.

In another embodiment of the present disclosure, as shown in FIGS. 5 and 6, the third side edge 131 of the auxiliary support layer 13 may be located on a side of the first side edge 111 of the first back film 11 and the second side edge 121 of the second back film 12 away from the bending portion 103. A spacing between the third side edge 131 of the auxiliary support layer 13 and the first side edge 111 of the first back film 11 may be less than or equal to 0.35 mm, such as 0.05 mm, 0.1 mm, 0.2 mm, 0.35 mm, and the like. A spacing between the third side edge 131 of the auxiliary support layer 13 and the second side edge 121 of the second back film 12 may be less than or equal to 0.35 mm, such as 0.05 mm, 0.1 mm, 0.2 mm, 0.35 mm, and the like. Such design may ensure that the two sides of the bending portion 103 (i.e., the regions where the display portion 101 and the binding portion 102 are located) have high strength.

It should be noted that when the first side edge 111 of the first back film 11 is flush with the second side edge 121 of the second back film 12, the spacing between the third side edge 131 of the auxiliary support layer 13 and the first side edge 111 of the first back film 11 may be equal to the spacing between the third side edge 131 of the auxiliary support layer 13 and the second side edge 121 of the second back film 12.

In another embodiment of the present disclosure, the third side edge 131 of the auxiliary support layer 13 may be located on a side of the first side edge 111 of the first back film 11 and the second side edge 121 of the second back film 12 close to the bending portion 103. The spacing between the third side edge 131 and the first side edge 111 may be less than or equal to 0.35 mm, and the spacing between the third side edge 131 and the second side edge 121 may also be less than or equal to 0.35 mm, such as 0.35 mm, 0.3 mm, 0.25 mm, 0.2 mm, 0.15 mm, 0.1 mm, 0.05 mm, and the like, which is not limited herein, as long as the spacing between the third side edge 131 of the auxiliary support layer 13 and the bending portion 103 is ensured to be greater than sums of a material accuracy, a fitting accuracy and a bending accuracy of the auxiliary support layer 13, so as to prevent the risk that the auxiliary support layer 13 damages the bending portion 103 during the bending of the flexible display panel 10.

In some embodiments of the present disclosure, as shown in FIGS. 3 to 6, in the flexible display panel 10, the orthographic projection of the binding portion 102 on the reference plane overlaps with a partial region of the orthographic projection of the display portion 101 on the reference plane. That is, an area of the display portion 101 is greater than an area of the binding portion 102. Specifically, a side edge of the display portion 101 away from the bending portion 103 is further away from the bending portion 103 than a side edge of the binding portion 102 away from the bending portion 103, and that is, the side edge of the display portion 101 away from the bending portion 103 exceeds the side edge of the binding portion 102 away from the bending portion 103. In the present embodiment, an area of the display portion 101 is far greater than an area of the binding portion 102, and a part of the display portion 101 exceeding the bending portion 103 may be bent or folded.

It should be noted that in the embodiment of the present disclosure, in order to realize that the first back film 11 has a good protection and buffering effect on the display portion 101 and the second back film 12 has a good protection and buffering effect on the binding portion 102, the first back film 11 needs to be fitted to the back side of the display portion 101 as closely as possible, and the second back film 12 needs to be fitted to the whole back side of the binding portion 102 as much as possible. It may be seen that when the area of the display portion 101 is far greater than the area of the binding portion 102, an area of the first back film 11 is also far greater than an area of the second back film 12.

When the area of the display portion 101 is far greater than the area of the binding portion 102, an entire surface of the auxiliary support layer 13 may be used to be fitted to the first back film 11, and the auxiliary support layer 13 may exceed the second back film 12. When the part of the display portion 101 exceeding the bending portion 103 is bent or folded, the auxiliary support layer 13 may also be bent or folded together with the display portion 101. Optionally, a thickness of the auxiliary support layer 13 ranges from 50 μm to 150 μm, such as 50 μm, 100 μm, 150 μm and the like. A via hole may be designed at a position of the auxiliary support layer 13 corresponding to a bending region of the display portion 101, so as to reduce a rigidity of the auxiliary support layer 13 and ensure the bending performance. When the thickness of the auxiliary support layer 13 is less than 50 μm and greater than or equal to 30 μm, the auxiliary support layer 13 itself has the good support ability and bending deformation ability without requiring the design of the via hole for auxiliary support layer 13.

In some embodiments of the present disclosure, as shown in FIGS. 3 to 6, an outer contour of an orthographic projection of the first adhesive layer 14 on the reference plane is located on an inner side of an outer contour of the orthographic projection of the first back film 11 on the reference plane, and a spacing between the outer contour of the orthographic projection of the first adhesive layer 14 on the reference plane and the outer contour of the orthographic projection of the first back film 11 on the reference plane is less than or equal to 0.2 mm. Such design may increase an adhesion area of the first adhesive layer 14 with the first back film 11 and the display portion 101 while ensuring non-overflow of adhesive, thereby ensuring the adhesive stability between the first back film 11 and the display portion 101.

It should be noted that, in case of ensuring the non-overflow of adhesive, the spacing between the outer contour of the orthographic projection of the first adhesive layer 14 on the reference plane and the outer contour of the orthographic projection of the first back film 11 on the reference plane should be as small as possible. In case of ensuring the non-overflow of adhesive, the orthographic projection of the first adhesive layer 14 on the reference plane may overlap with the orthographic projection of the first back film 11 on the reference plane.

Similarly, as shown in FIGS. 3 to 6, an outer contour of an orthographic projection of the second adhesive layer 15 on the reference plane is located on an inner side of an outer contour of the orthographic projection of the second back film 12 on the reference plane, and a spacing between the outer contour of the orthographic projection of the second adhesive layer 15 on the reference plane and the outer contour of the orthographic projection of the second back film 12 on the reference plane is less than or equal to 0.2 mm. Such design may increase an adhesion area of the second adhesive layer 15 with the second back film 12 and the binding portion 102 while ensuring non-overflow of adhesive, thereby ensuring the adhesive stability between the second back film 12 and the binding portion 102.

It should be noted that, in case of the non-overflow of adhesive, the spacing between the outer contour of the orthographic projection of the second adhesive layer 15 on the reference plane and the outer contour of the orthographic projection of the second back film 12 on the reference plane should be as small as possible. In case of ensuring the non-overflow of adhesive, the orthographic projection of the second adhesive layer 15 on the reference plane may overlap with the orthographic projection of the second back film 12 on the reference plane.

In an embodiment of the present disclosure, since the part of the display portion 101 exceeding the binding portion 102 may be bent or folded, in order to ensure that the part of the display portion 101 exceeding the binding portion 102 may have the good bending performance, the first adhesive layer 14 may have a small elastic modulus, and that is, the first adhesive layer 14 may have good flexibility while having good adhesive performance, so as to bend or fold with the display portion 101. In order to enable the flexible display panel 10 to meet requirement of a bending radius, the second adhesive layer 15 with a relatively large elastic modulus may be used to bond the auxiliary support layer 13 and the second back film 12. That is, the second adhesive layer 15 may have high strength while having good adhesive performance, such that that the flexible display panel 10 may meet the requirement of the bending radius and maintain the bending shape of the flexible display panel 10. Based on the foregoing, according to different requirements, an elastic modulus of the first adhesive layer 14 in the embodiment of the present disclosure may be less than that of the second adhesive layer 15.

For example, the above-mentioned first adhesive layer 14 may be an optical adhesive layer or a foam adhesive, while the second adhesive layer 15 may be a pressure sensitive adhesive. When the first adhesive layer 14 is an optical adhesive layer, a thickness of the optical adhesive layer ranges from 20 µm to 50 µm, such as 20 µm, 30 µm, 40 µm, 50 µm and the like. Such design may have the good bending performance and the good recovery deformation ability while ensuring the good adhesive performance. When the first adhesive layer 14 is the foam adhesive, a thickness of foam adhesive is greater than or equal to 130 µm. It should be understood that the thickness of the foam adhesive should not be too large, as long as the foam adhesive has the good bending performance and the good recovery deformation ability while having the good adhesive performance. It should be noted that the second adhesive layer 15 is not only used to bond the auxiliary support layer 13 and the second back film 12, but also enables the flexible display panel 10 to meet the requirement of the bending radius and maintain the bending shape of the flexible display panel 10. Thus, the thickness of the second adhesive layer 15 mainly depends on the bending radius or a thickness of other film layer of the bending portion 103, which is not specifically limited herein.

In some embodiments of the present disclosure, as shown in FIGS. 3 to 6, the display module may also include a strain neutral adhesive layer 16, which covers an outer side of the bending portion 103 as well as edge parts of the display portion 101 and the binding portion 102. The bending portion 103 of the flexible display panel 10 may be protected by providing the strain neutral adhesive layer 16, so as to prevent fracture during the bending. For example, the strain neutral adhesive layer 16 may be an organic adhesive material.

Figure 7:
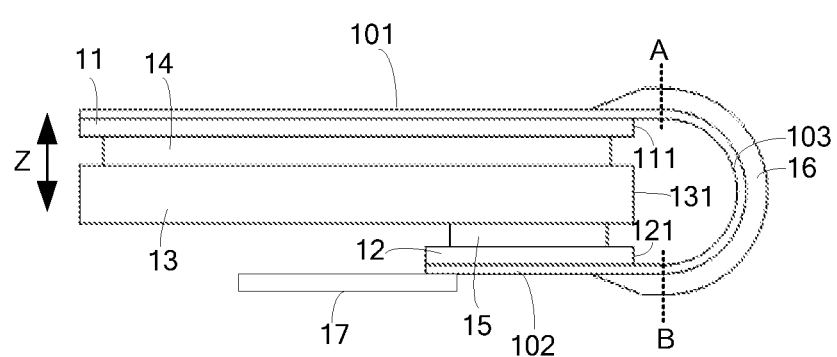
FIG. 7 shows a structural diagram of a display apparatus according to an embodiment of the present disclosure.

Embodiments of the present disclosure also provides a display apparatus, as shown in FIG. 7, which may include the display module described in any of the above embodiments. The structure of the display module will not be described in detail herein. The display apparatus may also include a flexible circuit board 17, which may be bound with the binding portion 102 of the flexible display panel 10.

It should be noted that, in addition to the above structure, the display apparatus also includes other necessary components and compositions, such as a cover plate, a touch function layer, a polarizer, a housing, a main circuit board, a power line, etc., which may be supplemented accordingly according to the specific use requirements of the display apparatus by the those skilled in the art, and will not be repeated herein.

In the embodiments of the present disclosure, a specific type of display apparatus is not specifically limited, and could be any type of the display apparatus commonly used in the related art, such as television, mobile phone, computer, watch, vehicle mounted equipment, medical equipment, etc. Those skilled in the art may select accordingly according to the specific use of the display apparatus, which will not be repeated herein.

Those skilled in the art will easily conceive other embodiments of the present disclosure after considering the specification and practicing the content disclosed herein. This disclosure is intended to cover any variations, uses, or adaptations of the present disclosure. These variations, uses, or adaptations are subject to the general principles of the present disclosure and include common general knowledge or conventional technical means in the art that are not disclosed in the present disclosure. The specification and examples are to be regarded as illustrative only, and the true scope and spirit of the present disclosure is pointed out by the appended claims.

What is claimed is:

1. A display module comprising:
   a flexible display panel comprising a display portion, a binding portion at a back side of the display portion, and a bending portion connecting the display portion and the binding portion;
   a first back film located between the display portion and the binding portion and fitted to the back side of the display portion, wherein an orthographic projection of the first back film on a reference plane is located in or overlaps with an orthographic projection of the display portion on the reference plane; a side edge of the first back film close to the bending portion is a first side edge;
   a second back film fitted to a side of the binding portion facing the display portion, wherein an orthographic projection of the second back film on the reference plane is located in or overlaps with an orthographic projection of the binding portion on the reference plane; a side edge of the second back film close to the bending portion is a second side edge;
   an auxiliary support layer located between the first back film and the second back film, wherein the auxiliary support layer is bonded with the first back film through a first adhesive layer, and is bonded with the second back film through a second adhesive layer; a side edge of the auxiliary support layer close to the bending portion is a third side edge; wherein a spacing between the third side edge and the first side edge ranges from 0 to 0.35 mm, a spacing between the third side edge and the second side edge ranges from 0 to 0.35 mm; and
   an elastic modulus of the auxiliary support layer is greater than an elastic modulus of the first back film and an elastic modulus of the second back film, and the reference plane is a plane perpendicular to a thickness direction of the display module.

2. The display module according to claim 1, wherein,
   a boundary line between the bending portion and the display portion is a first boundary line, and a boundary line between the bending portion and the binding portion is a second boundary line; wherein:
   the first side edge is located on a side of the first boundary line away from the bending portion and a spacing between the first side edge and the first boundary line is less than or equal to 0.1 mm; and
   the second side edge is located on a side of the second boundary line away from the bending portion and a spacing between the second side edge and the second boundary line is less than or equal to 0.1 mm.

3. The display module according to claim 1, wherein, the third side edge is flush with at least one of the first side edge and the second side edge.

4. The display module according to claim 2, wherein the first side edge, the second side edge and the third side edge are flush with each other.

5. The display module according to claim 1, wherein the third side edge is located on sides of the first side edge and the second side edge away from the bending portion.

6. The display module according to claim 1, wherein the elastic modulus of the auxiliary support layer ranges from 150 GPa to 200 GPa, and the elastic modulus of the first back film and the elastic modulus of the second back film range from 3 GPa to 9 GPa.

7. The display module according to claim 6, wherein a material of the auxiliary support layer is stainless steel, and a material of the first back film and a material of the second back film are polyethylene terephthalate or polyimide.

8. The display module according to claim 1, wherein a thickness of the auxiliary support layer ranges from 30 μm to 150 μm.

9. The display module according to claim 1, wherein the orthographic projection of the binding portion on the reference plane overlaps with a partial region of the orthographic projection of the display portion on the reference plane.

10. The display module according to claim 9, wherein,
    an orthographic projection of the first adhesive layer on the reference plane overlaps with the orthographic projection of the first back film on the reference plane; or
    an outer contour of an orthographic projection of the first adhesive layer on the reference plane is located on an inner side of an outer contour of the orthographic projection of the first back film on the reference plane, and a spacing between the outer contour of the orthographic projection of the first adhesive layer on the reference plane and the outer contour of the orthographic projection of the first back film on the reference plane is less than or equal to 0.2 mm.

11. The display module according to claim 9, wherein,
    an orthographic projection of the second adhesive layer on the reference plane overlaps with the orthographic projection of the second back film on the reference plane; or
    an outer contour of an orthographic projection of the second adhesive layer on the reference plane is located on an inner side of an outer contour of the orthographic projection of the second back film on the reference plane, and a spacing between the outer contour of the orthographic projection of the second adhesive layer on the reference plane and the outer contour of the orthographic projection of the second back film on the reference plane is less than or equal to 0.2 mm.

12. The display module according to claim 10, wherein an elastic modulus of the first adhesive layer is less than an elastic modulus of the second adhesive layer.

13. The display module according to claim 12, wherein the first adhesive layer is an optical adhesive layer or a foam adhesive, and the second adhesive layer is a pressure sensitive adhesive.

14. The display module according to claim 13, wherein,
    the first adhesive layer is the optical adhesive layer, and a thickness of the optical adhesive layer ranges from 20 μm to 50 μm; or
    the first adhesive layer is the foam adhesive, and a thickness of the foam adhesive is greater than or equal to 130 μm.

15. The display module according to claim 1, further comprising:
    a strain neutral adhesive layer, wherein the strain neutral adhesive layer covers an outer side of the bending portion as well as edge parts of the display portion and the binding portion.

16. A display apparatus, comprising a flexible circuit board and a display module, the display module comprises:
    a flexible display panel comprising a display portion, a binding portion at a back side of the display portion, and a bending portion connecting the display portion and the binding portion;
    a first back film located between the display portion and the binding portion and fitted to the back side of the display portion, wherein an orthographic projection of the first back film on a reference plane is located in or overlaps with an orthographic projection of the display portion on the reference plane; a side edge of the first back film close to the bending portion is a first side edge;

a second back film fitted to a side of the binding portion facing the display portion, wherein an orthographic projection of the second back film on the reference plane is located in or overlaps with an orthographic projection of the binding portion on the reference plane; a side edge of the second back film close to the bending portion is a second side edge;

an auxiliary support layer located between the first back film and the second back film, wherein the auxiliary support layer is bonded with the first back film through a first adhesive layer, and is bonded with the second back film through a second adhesive layer; a side edge of the auxiliary support layer close to the bending portion is a third side edge; wherein a spacing between the third side edge and the first side edge ranges from 0 to 0.35 mm, a spacing between the third side edge and the second side edge ranges from 0 to 0.35 mm; and an elastic modulus of the auxiliary support layer is greater than an elastic modulus of the first back film and an elastic modulus of the second back film, and the reference plane is a plane perpendicular to a thickness direction of the display module;

wherein the binding portion of the flexible display panel is bound to the flexible circuit board.

17. The display apparatus according to claim 16, wherein, a boundary line between the bending portion and the display portion is a first boundary line, and a boundary line between the bending portion and the binding portion is a second boundary line; wherein:

the first side edge is located on a side of the first boundary line away from the bending portion and a spacing between the first side edge and the first boundary line is less than or equal to 0.1 mm; and the second side edge is located on a side of the second boundary line away from the bending portion and a spacing between the second side edge and the second boundary line is less than or equal to 0.1 mm.

18. The display apparatus according to claim 16, wherein, the third side edge is flush with at least one of the first side edge and the second side edge.

19. The display apparatus according to claim 17, wherein the first side edge, the second side edge and the third side edge are flush with each other.

20. The display apparatus according to claim 16, wherein the third side edge is located on sides of the first side edge and the second side edge away from the bending portion.

* * * * *